US009722571B2

(12) United States Patent
Tsai

(10) Patent No.: US 9,722,571 B2
(45) Date of Patent: *Aug. 1, 2017

(54) RADIO FREQUENCY TRANSMITTER, POWER COMBINERS AND TERMINATIONS THEREFOR

(71) Applicant: MEDIATEK INC., Hsin-Chu (TW)

(72) Inventor: Ming-Da Tsai, Miaoli County (TW)

(73) Assignee: MediaTek, Inc., Hsin-Chu (TW)

( * ) Notice: Subject to any disclaimer, the term of this patent is extended or adjusted under 35 U.S.C. 154(b) by 474 days.

This patent is subject to a terminal disclaimer.

(21) Appl. No.: 14/140,519

(22) Filed: Dec. 25, 2013

(65) Prior Publication Data

US 2014/0357206 A1  Dec. 4, 2014

Related U.S. Application Data

(60) Provisional application No. 61/828,850, filed on May 30, 2013.

(51) Int. Cl.
*H03H 7/48* (2006.01)
*H04B 1/04* (2006.01)
*H01F 19/04* (2006.01)

(52) U.S. Cl.
CPC .............. *H03H 7/48* (2013.01); *H01F 19/04* (2013.01); *H04B 1/0458* (2013.01); *Y02B 60/50* (2013.01)

(58) Field of Classification Search
CPC combination set(s) only.
See application file for complete search history.

(56) References Cited

U.S. PATENT DOCUMENTS

| 5,451,914 A * | 9/1995 | Stengel .............. H01F 17/0006 333/25 |
| 5,477,204 A | 12/1995 | Li |
| 6,816,012 B2 | 11/2004 | Aoki |
| 6,889,034 B1 * | 5/2005 | Dent .................... H04B 1/0458 455/102 |
| 6,992,377 B2 | 1/2006 | Zhou et al. |
| 7,049,694 B2 | 5/2006 | Zhou et al. |

(Continued)

FOREIGN PATENT DOCUMENTS

| CN | 102931922 A | 2/2013 |
| JP | 2007157958 A | 6/2007 |

OTHER PUBLICATIONS

Kanda, A Fully Integrated Triple-Band CMOS Power Amplifier for WCDMA Mobile Handsets, pp. 86-87 and a page including Figure 4.7.7, ISSCC 2012/ Session 4/ RF Techniques/ 4.7.

(Continued)

*Primary Examiner* — Junpeng Chen
(74) *Attorney, Agent, or Firm* — Wolf, Greenfield & Sacks, P.C.

(57) ABSTRACT

A power combiner includes a planar figure-8 shaped primary winding and a planar figure-8 shaped secondary winding; wherein, the planar figure-8 shaped primary winding is substantially overlaid with the planar figure-8 shaped secondary winding. In addition, there is provided a radio frequency (RF) transmitter having a power combiner, where the power combiner includes a planar figure-8 shaped primary winding and a planar figure-8 shaped secondary winding, wherein the planar figure-8 shaped primary winding is substantially overlaid with the planar figure-8 shaped secondary winding.

18 Claims, 9 Drawing Sheets

(56) References Cited

U.S. PATENT DOCUMENTS

| | | |
|---|---|---|
| 7,256,488 B2 | 8/2007 | Zhou et al. |
| 7,355,479 B2 | 4/2008 | Van Der Heijden |
| 7,471,153 B2 | 12/2008 | Kee |
| 7,471,156 B2 | 12/2008 | Thompson et al. |
| 7,498,571 B2 | 3/2009 | Makarov et al. |
| 7,592,865 B2 | 9/2009 | Park et al. |
| 7,675,365 B2 | 3/2010 | Lee |
| 7,746,174 B2 | 6/2010 | Yang et al. |
| 7,777,570 B2 | 8/2010 | Lai |
| 7,880,547 B2 | 2/2011 | Lee et al. |
| 8,030,613 B2 | 10/2011 | Makarov et al. |
| 8,581,185 B2 | 11/2013 | Makarov et al. |
| 8,797,135 B2 | 8/2014 | Lai |
| 8,869,383 B2 | 10/2014 | Xu et al. |
| 8,912,865 B2 | 12/2014 | Kim et al. |
| 8,994,488 B2 | 3/2015 | Lai |
| 9,000,363 B2 | 4/2015 | Makarov et al. |
| 9,077,310 B2 | 7/2015 | Tsai |
| 9,130,537 B2 | 9/2015 | Tsai |
| 9,472,385 B2 | 10/2016 | Makarov et al. |
| 2006/0077028 A1* | 4/2006 | Huang .............. H01F 17/0006 336/223 |
| 2010/0148866 A1 | 6/2010 | Lee et al. |
| 2010/0270999 A1* | 10/2010 | Lai ..................... H01F 19/04 323/361 |
| 2012/0274431 A1* | 11/2012 | Kato ................. H01P 1/20345 336/182 |
| 2014/0084700 A1* | 3/2014 | Anderson ........... H03F 1/0227 307/104 |
| 2014/0354371 A1 | 12/2014 | Tsai |
| 2015/0040381 A1 | 2/2015 | Xu et al. |
| 2015/0206634 A1* | 7/2015 | Yan .................. H01F 17/0006 336/182 |

OTHER PUBLICATIONS

Kim, An EDGE/GSM Quad-Band CMOS Power Amplifier, pp. 430-431 and a page including Figure 24.4.7, ISSCC 2011/ Session 24/ Transmitter Blocks/ 24.4.

Liu, Fully Integrated CMOS Power Amplifier With Efficiency Enhancement at Power Back-Off, IEEE Journal of Solid-State Circuits, vol. 43, No. 3, pp. 600-609, Mar. 2008.

* cited by examiner

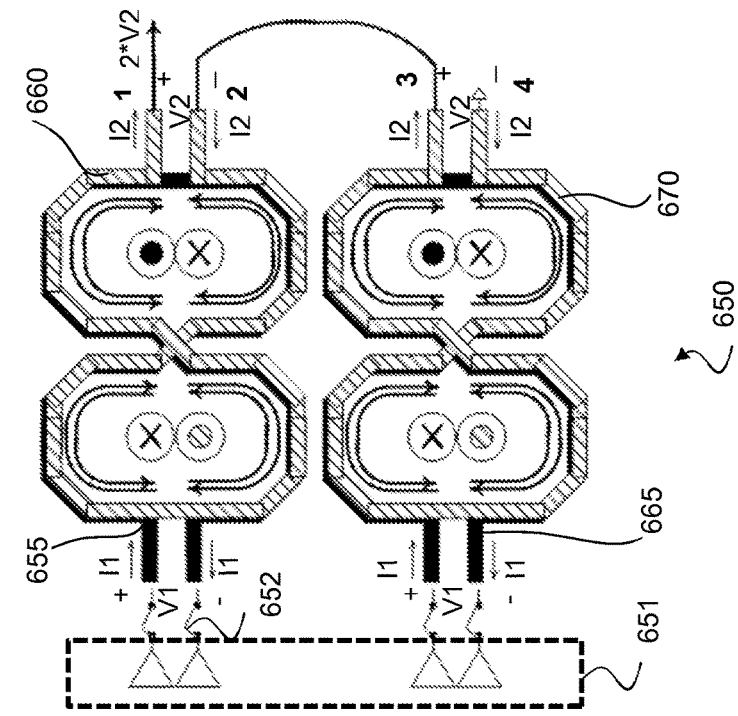
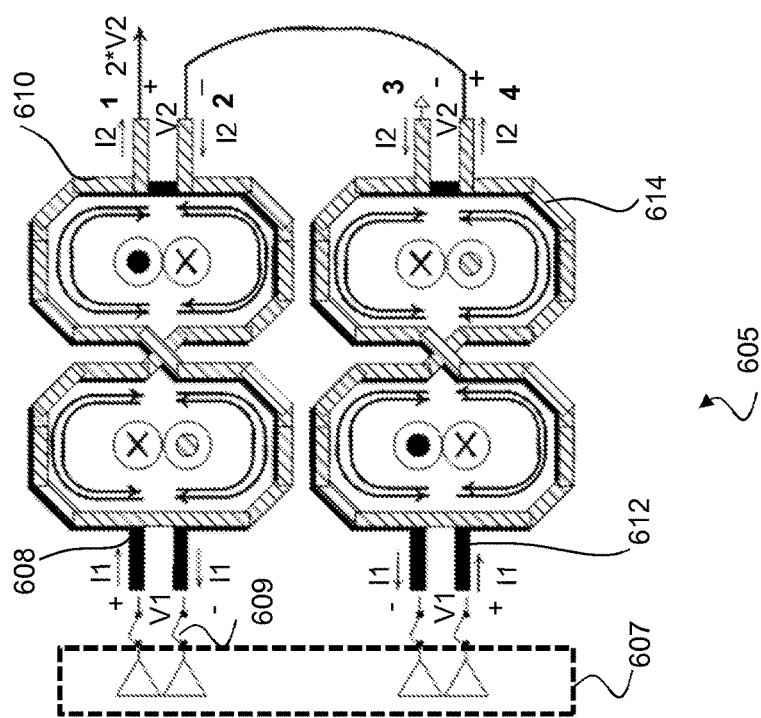
FIG. 6

RADIO FREQUENCY TRANSMITTER, POWER COMBINERS AND TERMINATIONS THEREFOR

CROSS REFERENCE TO RELATED APPLICATIONS

This application claims the benefit of U.S. provisional application No. 61/828,850, filed on May 30, 2013 and incorporated herein by reference.

BACKGROUND

Field of the Invention

The field of this invention relates to radio frequency transmitters power combiners and harmonic terminations therefor. The invention is applicable to, but not limited to, power combining techniques.

Background of the Invention

In the field of complementary metal-oxide-semiconductor (CMOS) power amplifiers, there is a constant demand by consumers for wireless systems that are low cost, efficient and reliable. High level integration has been shown in practice to be an effective way to reduce cost and achieve compactness for high volume applications. Currently, almost all power amplifiers are manufactured with III-V compound semiconductors, as this type of device has high output power and high power efficiency, which are desired attributes for many power amplifier applications. It is currently very difficult to achieve these specifications using CMOS technology. However, III-V technologies have high manufacturing costs, as well as being unable to provide a complete system-on-chip (SoC) solution.

Recently, CMOS power amplifiers coupled to power devices have become more attractive, partly because the power device technology and processing has matured and become lower cost. However, in implementing CMOS power amplifiers and integrating with power devices, there is still a need to improve the coupling, efficiency, and termination efficiency of these devices. Such devices are often used in radio frequency transmitters, for either base station or subscriber unit devices.

Referring first to FIG. 1, a simplified integrated radio frequency power amplifier (RF PA) system 100 comprises integrated circuit 102 and integrated power devices 150, 170. Integrated circuit 102 comprises power inputs 104 operably coupled to isolation transformers 106. The outputs of the isolation transformers 106 are operably coupled to respective driver stages 108 wherein the driver stages 108 provide amplified radio frequency signals to inputs of power stages 110, e.g. power amplifiers. In this case, the respective power stages 110 are operably coupled, via a plurality of bond wires 112, to power combiner devices 150, 170. Generally, the bond wires 112 are kept as short as possible in order to minimise radio frequency signal losses, as well as to reduce the area taken up by the integrated RF PA system 100, which is especially useful when using CMOS devices.

Due to the closeness of many of the inductive components within the integrated RF PA system 100, there are a number of potentially problematic effects. For example, there can be mutual coupling between the bond wires 112 and the power combiner elements 152, 172 of the integrated power combiner devices 150, 170. There may also be mutual coupling between the power combiner elements 152 and 172 themselves within the integrated power combiner devices 150, 170. These can be caused by an imbalanced impedance transformation and poor common-mode harmonic suppression within the integrated power combiner devices 150, 170. This problem is usually solved by increasing the spacing between the integrated power combiner devices 150, 170. However, this is not always a viable option for devices when trying to reduce the overall size of the integrated system 100.

Another common problem is centre-tap harmonic bounce at the connectors 114 between the IC 102 and integrated power combiner devices 150, 170. This, again, can be caused by an imbalanced impedance transformation and poor common-mode harmonic suppression.

Thus, a need exists for an improved coupling regime between RF IC 102 and integrated power combiner devices 150, 170.

Referring now to FIG. 2, there is illustrated a simplified known power combiner 200 that may be utilised in FIG. 1, for example, within the integrated power devices 150, 170. Simplified known power combiner 200 comprises two primary windings 201, 203, operably coupled to input connectors 205, and further operably coupled to each other via centre tap connector 207, and secondary winding 209, which is somewhat isolated from the two primary windings 201, 203.

A schematic diagram of the layout of such a simplified known power combiner 200 is illustrated in 250, which comprises a series of primary windings 260, 270, 280, 290 that are isolated from each other, and a 'figure 8' layout for the secondary winding 254. Each isolated primary winding 260, 270, 280, 290 comprises an interleaved structure 252 situated above and below the secondary winding 254, which reduces losses and enhances magnetic coupling. Due to the 'figure 8' layout for the secondary winding 254, the secondary winding is somewhat immune to common mode disturbances because the incoming magnetic flux induces currents of opposite direction across each 'figure 8' section. In this case, the interleaved structure 252 of the primary windings 260, 270, 280, 290 are operably coupled to each other at supply modules 256. In this case, the 'figure 8' secondary winding 254 is operably inductively coupled to all of the primary windings, 260, 270, 280, 290.

An illustration of current flows in schematic diagram 250 are illustrated in 295, which comprises a section of secondary winding 254, and primary winding 260. In this illustration, the interleaved structure 252 of primary winding 260 has been offset to illustrate current flows in each part of the interleaved structure 252. The interleaved structure 252 of the primary winding 260 facilitates coupling above and below the section of the secondary winding 254.

From the illustration of current flows in 295, it should be clear that the series of primary windings 260, 270, 280, 290 are not in 'figure-8' structures, but a series of non-figure-8' shaped primaries that are isolated from each other. Further, the resultant current flow in secondary winding 254 runs perpendicular to the current in the series of primary windings 260, 270, 280, 290.

A potential problem with this structure is that the primary windings 260, 270, 280, 290 will still couple to each other, which would result in an imbalanced impedance transformation and poor common-mode harmonic suppression at each differential port. In some severe cases, an imbalanced impedance transformation may affect the output power and efficiency of this structure.

It is known that mutual coupling can be a serious problem for certain devices, for example radio frequency transceivers, as the effect of mutual coupling can change antenna array radiation patterns and alter matching characteristics of antenna elements. Thus, a need exists for an improved power combiner for an IC.

In some cases, it may be desirable to suppress the common-mode power of a power combiner. In the field of this invention, this is achieved by terminating at the fundamental frequency of a power amplifier.

Thus, a need exists for an improved power combiner, a transformer and a termination arrangement for a radio frequency transmitter, for example a power combining IC.

SUMMARY

Accordingly, the invention seeks to mitigate, alleviate or eliminate one or more of the above mentioned disadvantages singly or in any combination. Aspects of the invention provide a power combiner for a radio frequency power device, and a radio frequency transmitter comprising a power combiner as described in the appended claims.

According to a first aspect of the invention, there is provided a power combiner for a radio frequency (RF) transmitter comprises a first planar figure-8 shaped primary winding; and a first planar figure-8 shaped secondary winding; wherein, the first planar figure-8 shaped primary winding is substantially overlaid with the first planar figure-8 shaped secondary winding. In this manner, such a figure-8 structure may provide symmetric coupling between primary winding(s) and secondary winding(s), thereby providing an opportunity to reduce mutual coupling between the respective windings.

Thus, in one example embodiment of the invention, the current flowing through a first section of the first planar figure-8 shaped primary winding may be reversed when compared to current flowing through a second section of the first planar figure-8 shaped primary winding, thereby forming anti-phase induced magnetic fields between the first section and second section of the first planar figure-8 shaped primary winding. When the current flowing through a first section of the first planar figure-8 shaped secondary winding is also reversed when compared to current flowing through a second section of the first planar figure-8 shaped secondary winding, thereby forming additional anti-phase induced magnetic fields between the first section and second section of the first planar figure-8 shaped secondary winding, constructive and power-efficient combination of signals at an output port may be achieved.

According to an optional feature of the invention, the power combiner may further comprise a second planar figure-8 shaped primary winding thereby forming a figure-88 shaped primary winding; and a second planar figure-8 shaped secondary winding thereby forming a figure-88 shaped secondary winding; wherein, the figure-88 shaped primary winding may be substantially overlaid with the figure-88 shaped secondary winding. In this manner, the coupling between first primary winding and second primary winding may be configured to be reduced, or cancelled altogether, due to a configured phase mismatch between generated magnetic fields.

According to an optional feature of the invention, a plurality of the first planar figure-8 shaped primary and secondary windings may be formed from two substantially oval-shaped tracks that may be operably cross coupled substantially at a mid-point of a longest length of the oval shape.

According to an optional feature of the invention, the overlaid location of the figure-88 shaped primary winding and figure-88 shaped secondary winding may be operable to facilitate reduction of inductive coupling.

According to an optional feature of the invention, the planar figure-8 shaped primary windings may be coupled to the planar figure-8 shaped secondary windings in a symmetrical manner.

According to an optional feature of the invention, the first planar figure-8 shaped primary winding and second planar figure-8 shaped primary windings may each comprise a first and second coupling port wherein, current may be operable to flow into the first coupling port and out of the second coupling port.

According to an optional feature of the invention, the current operable to flow into the first coupling port may have a magnetic field that is out of phase with a current operable to flow out of the second coupling port. In one example, a phase difference between the current operable to flow into the first coupling port and the current operable to flow out of the second coupling port may be substantially an odd multiple of a wavelength ($\pi$) of a signal being carried by the power combiner. In one example, the phase difference between the current operable to flow into the first coupling port and the current operable to flow out of the second coupling port may be operable to reduce coupling between the first planar figure-8 shaped primary winding and the second planar figure-8 shaped primary winding According to an optional feature of the invention, the first planar figure-8 shaped secondary winding and second planar figure-8 shaped secondary winding each comprise a first and second port arranged to support differential excitation.

According to an optional feature of the invention, the second port ('2') of the first planar figure-8 shaped secondary winding may be operably coupled to the second port ('4') of the second planar figure-8 shaped secondary winding, thereby supporting mirror differential excitation voltage mode combining.

According to an optional feature of the invention, the first port ('1') of the first planar figure-8 shaped secondary winding may be arranged to provide an output voltage following mirror differential excitation voltage mode combining.

According to an optional feature of the invention, the second port ('2') of the first planar figure-8 shaped secondary winding may be operably coupled to the first port ('3') of the second planar figure-8 shaped secondary winding, thereby supporting sequential differential excitation voltage mode combining.

According to an optional feature of the invention, the first port ('1') of the first planar figure-8 shaped secondary winding may be arranged to provide an output voltage following sequential differential excitation voltage mode combining.

According to an optional feature of the invention, the second port ('2') of the first planar figure-8 shaped secondary winding may be operably coupled to the first port ('3') of the second planar figure-8 shaped secondary winding and provide an output current, thereby supporting mirror differential excitation current mode combining.

According to an optional feature of the invention, the first port ('1') of the first planar figure-8 shaped secondary winding may be operably coupled to the first port ('3') of the second planar figure-8 shaped secondary winding and may provide an output current, thereby supporting sequential differential excitation current mode combining According to a second aspect of the invention, there is provided a radio frequency transmitter comprising a power combiner comprising: a planar figure-8 shaped primary winding; and a planar figure-8 shaped secondary winding; wherein, the planar figure-8 shaped primary winding is substantially overlaid with the planar figure-8 shaped secondary winding.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

FIG. 6 illustrates a further example of an alternative power combiner utilising aspects of the invention.

DETAILED DESCRIPTION

Examples of the invention will be described in terms of a power combiner for a radio frequency (RF) transmitter that comprises a planar figure-8 shaped primary winding; and a planar figure-8 shaped secondary winding; wherein, the figure-8 shaped primary winding is substantially overlaid with the figure-8 shaped secondary winding. In this manner, such a figure-8 structure may provide symmetric coupling between the primary winding(s) and secondary winding(s), thereby providing an opportunity to reduce mutual coupling between the respective windings. However, it will be appreciated by a skilled artisan that the inventive concept herein described may be embodied in any type of RF transmitter and/or power combiner comprising: a primary winding and a secondary winding.

Figure 8:
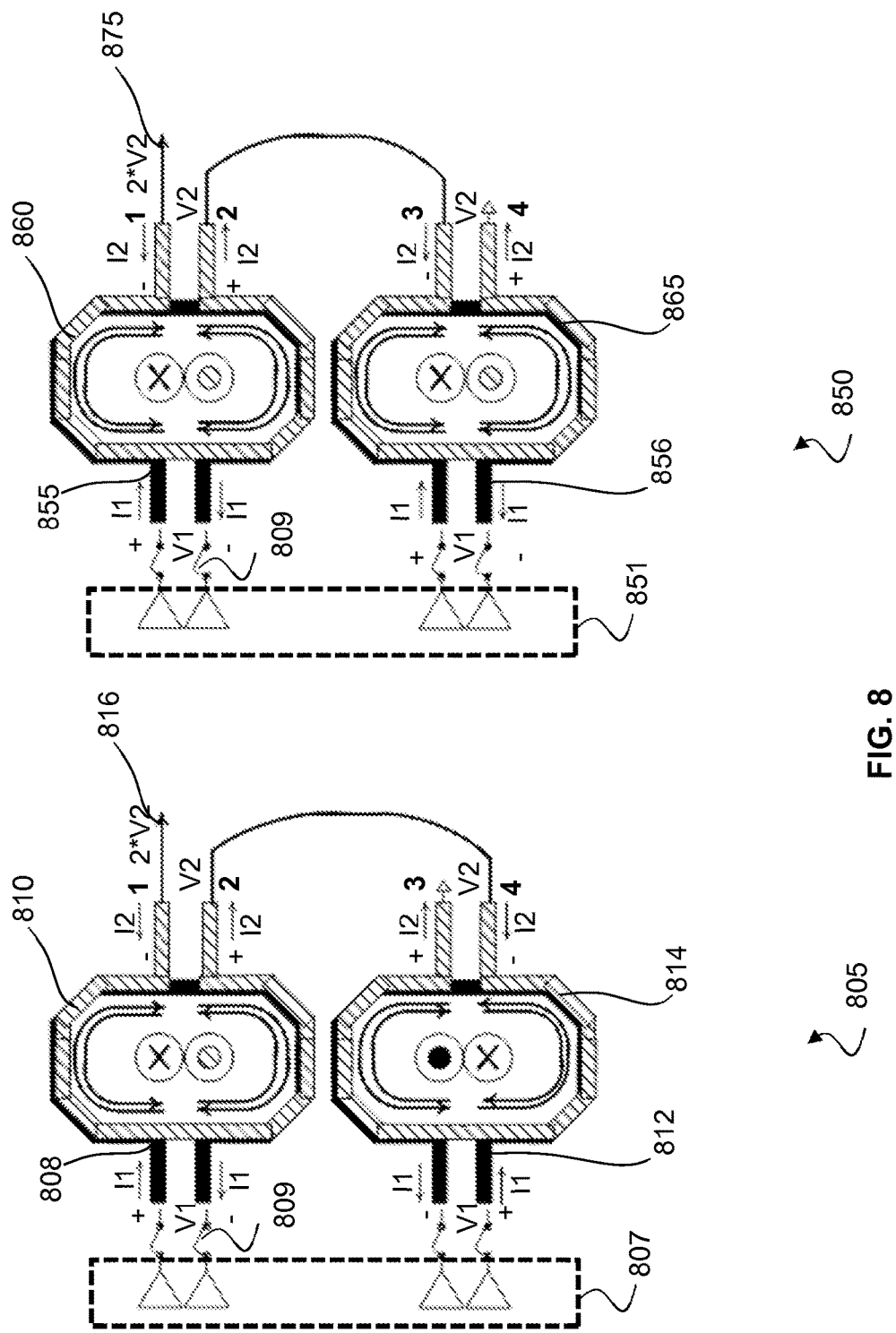
FIG. 8 illustrates an example implementation of a power combiner.

Examples of the invention will also be described in terms of a current flowing through a first section of the planar figure-8 shaped primary winding being reversed when compared to current flowing through a second section of the planar figure-8 shaped primary winding, thereby forming anti-phase induced magnetic fields between the first section and second section of the first primary winding. Similarly, when the current flowing through a first section of the planar figure-8 shaped secondary winding is also reversed when compared to current flowing through a second section of the planar figure-8 shaped secondary winding, additional anti-phase induced magnetic fields between the first section and second section of the secondary winding may be formed, and constructive and power-efficient combination of signals at an output port may be achieved. As such, hereinafter for some example embodiments, the terms primary winding and secondary winding may be interchanged, as would be appreciated by a skilled artisan.

Some examples of the invention are also described with regard to the power combiner further comprising a second planar figure-8 shaped primary winding, which together with the first planar figure-8 shaped primary winding thereby forms a figure-88 shaped primary winding; and a second planar figure-8 shaped secondary winding, which together with the first planar figure-8 shaped secondary winding thereby forms a figure-88 shaped secondary winding; wherein, the figure-88 shaped primary winding may be substantially overlaid with the figure-88 shaped secondary winding. In this manner, the coupling between first primary winding and second primary winding may be configured to be reduced, or cancelled altogether, due to a configured phase mismatch between generated magnetic fields Although examples of the invention will be described in terms of substantially oval-shaped tracks that are operably cross coupled substantially at a mid-point of a longest length of the oval shape, it is envisaged that other shaped track designs and/or cross coupling at other than an accurate mid-point of a longest length of the oval shape may be used. Furthermore, although examples of the invention will be described in terms of substantially overlaying a figure-8 or figure-88 shaped primary winding with a figure-8 or figure-88 shaped secondary winding, it is envisaged that the overlaying may be configured to be sufficient to induce the corresponding desired induced magnetic fields, and therefore, in some examples, the respective winding structures may not need to be wholly accurately overlain with one another.

Some examples of the invention are also described with regard to supporting mirror differential excitation current mode combining and/or sequential differential excitation voltage mode combining. However, it is envisaged that the inventive concept may be applied to other forms of power combining.

Figure 1:
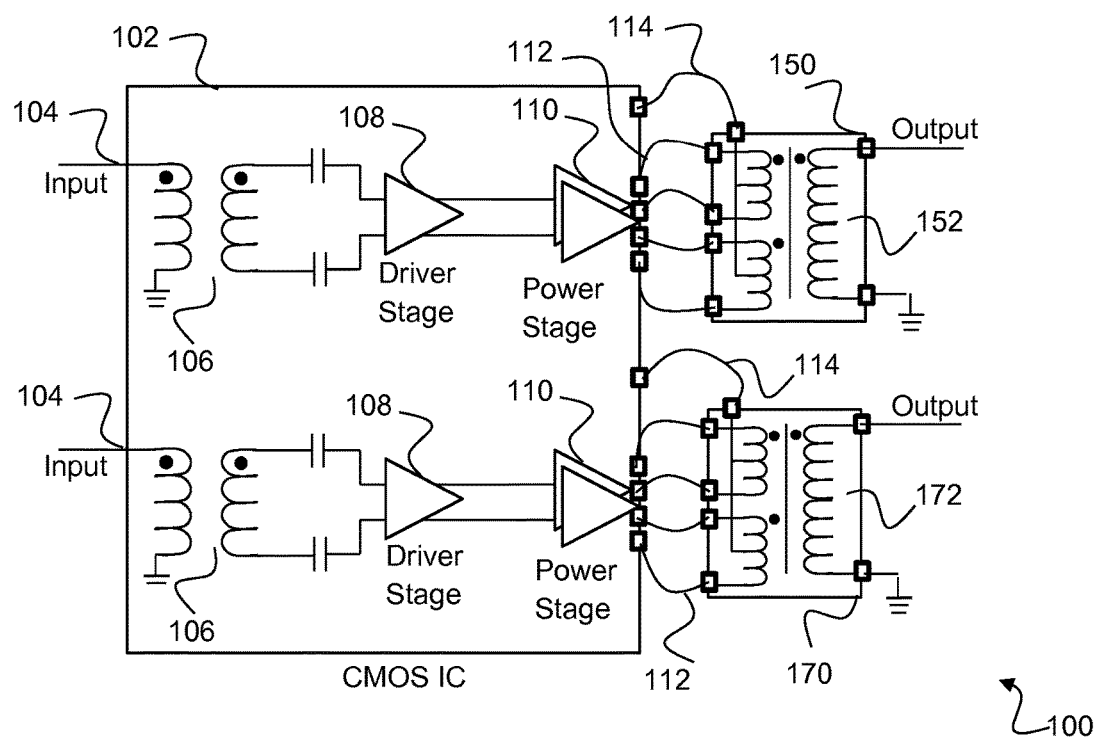
FIG. 1 illustrates a known example of a RF PA integrated system.
Figure 2:
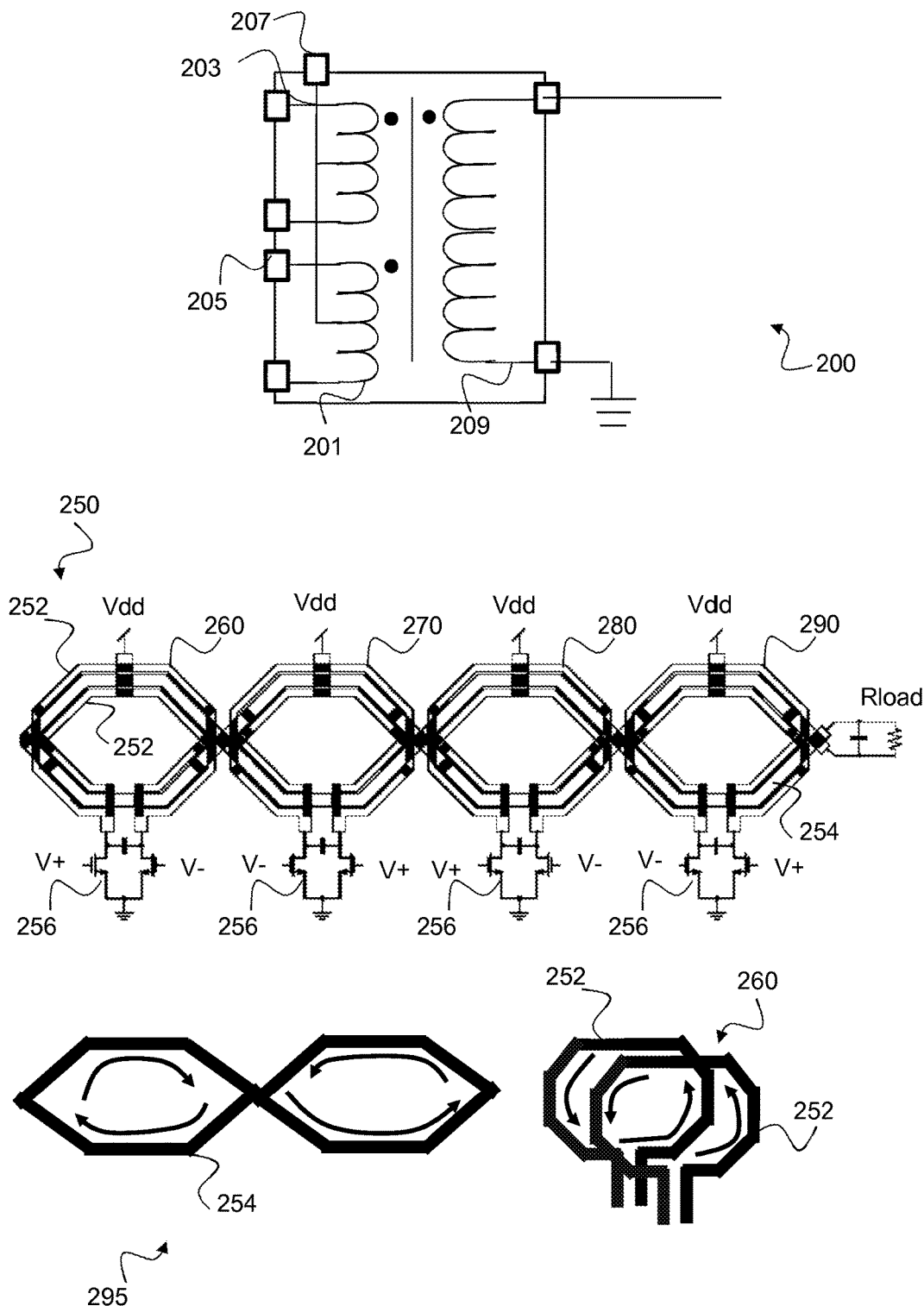
FIG. 2 illustrates a known example of a RF power combiner.
Figure 3:
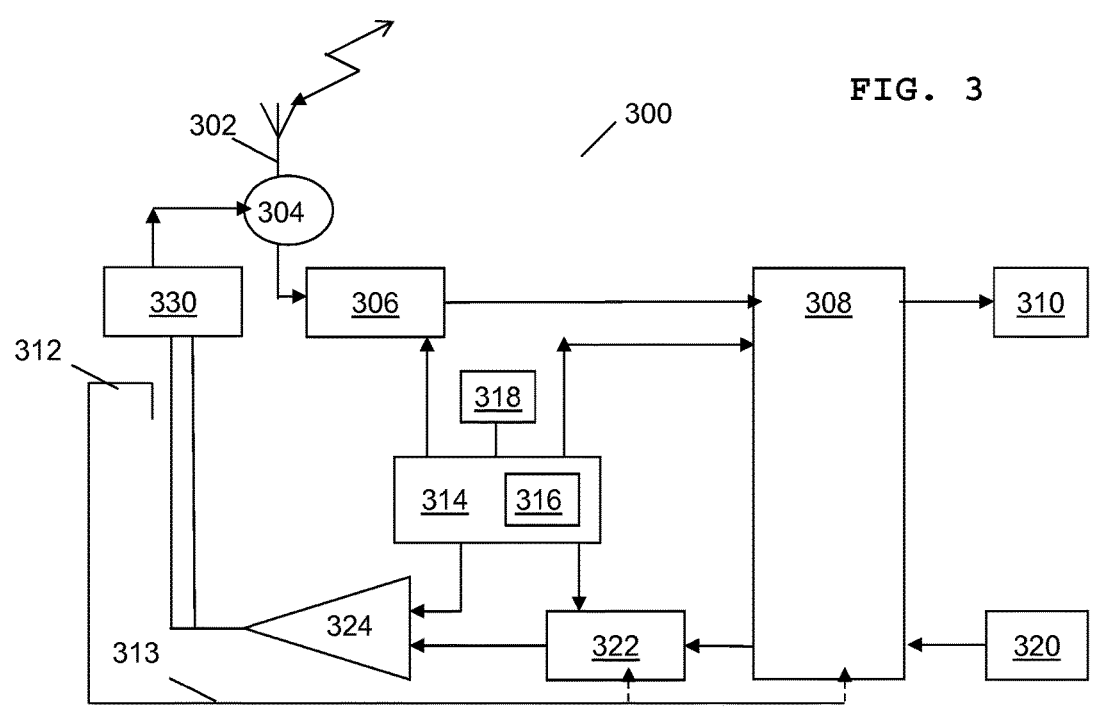
FIG. 3 illustrates an example block diagram of a simplified wireless communication unit, according to aspects of the invention.

Referring first to FIG. 3, a block diagram of a wireless communication unit (sometimes referred to as a mobile subscriber unit (MS) in the context of cellular communications or a user equipment (UE) in terms of a $3^{rd}$ generation partnership project (3GPP™) communication system) is shown, in accordance with one example embodiment of the invention.

The wireless communication unit 300 contains a transceiver having an antenna 302 coupled to an antenna switch or a duplexer 304. Further, the receiver chain, as known in the art, includes receiver front-end circuitry 306 (effectively providing reception, filtering and intermediate or base-band frequency conversion). The front-end circuitry 306 is serially coupled to a signal processing function 308. An output from the signal processing function 308 is provided to a suitable output device 310, such as a screen or flat panel display. The receiver chain also includes a controller 314 that maintains overall subscriber unit control. The controller 314 is also coupled to the receiver front-end circuitry 306 and the signal processing function 308 (generally realised by a digital signal processor (DSP)). The controller is also coupled to a memory device 316 that selectively stores operating regimes, such as decoding/encoding functions, synchronisation patterns, code sequences, and the like. A timer 318 is operably coupled to the controller 314 to control the timing of operations (transmission or reception of time-dependent signals) within the wireless communication unit 300.

As regards the transmit chain, this essentially includes an input device 320, such as a keypad, coupled in series via signal processor function 308 through transmitter/modulation circuitry 322 and a power amplifier 324 to antenna 302. A coupler 312 is typically located between the power amplifier 324 and the antenna 302 and arranged to route a portion of the transmit signal (that is output to the antenna 302) to baseband processing circuitry via feedback path 313, for example located in either transmitter/modulation circuitry 322 or signal processor function 308. The transmitter/modulation circuitry 322 and the power amplifier 324 are operationally responsive to the controller 314.

In this example, wireless communication unit 300 may optionally employ an integrated power device 330 between the output of the power amplifier 324 and the input to antenna switch or duplexer 304. Various concepts for integrated power device 330 are illustrated in one or more later figures. In some examples, the integrated power device 330 may receive more than one coupled signal from the output of power amplifier 324. In some examples, the more than one coupled signal may be a differential pair of signals, which may, in some examples, be cross coupled with other differential pairs of signals from other power amplifiers (not shown). Thus, in some examples, power amplifier 324 may comprise a plurality of power amplifiers.

Figure 4:
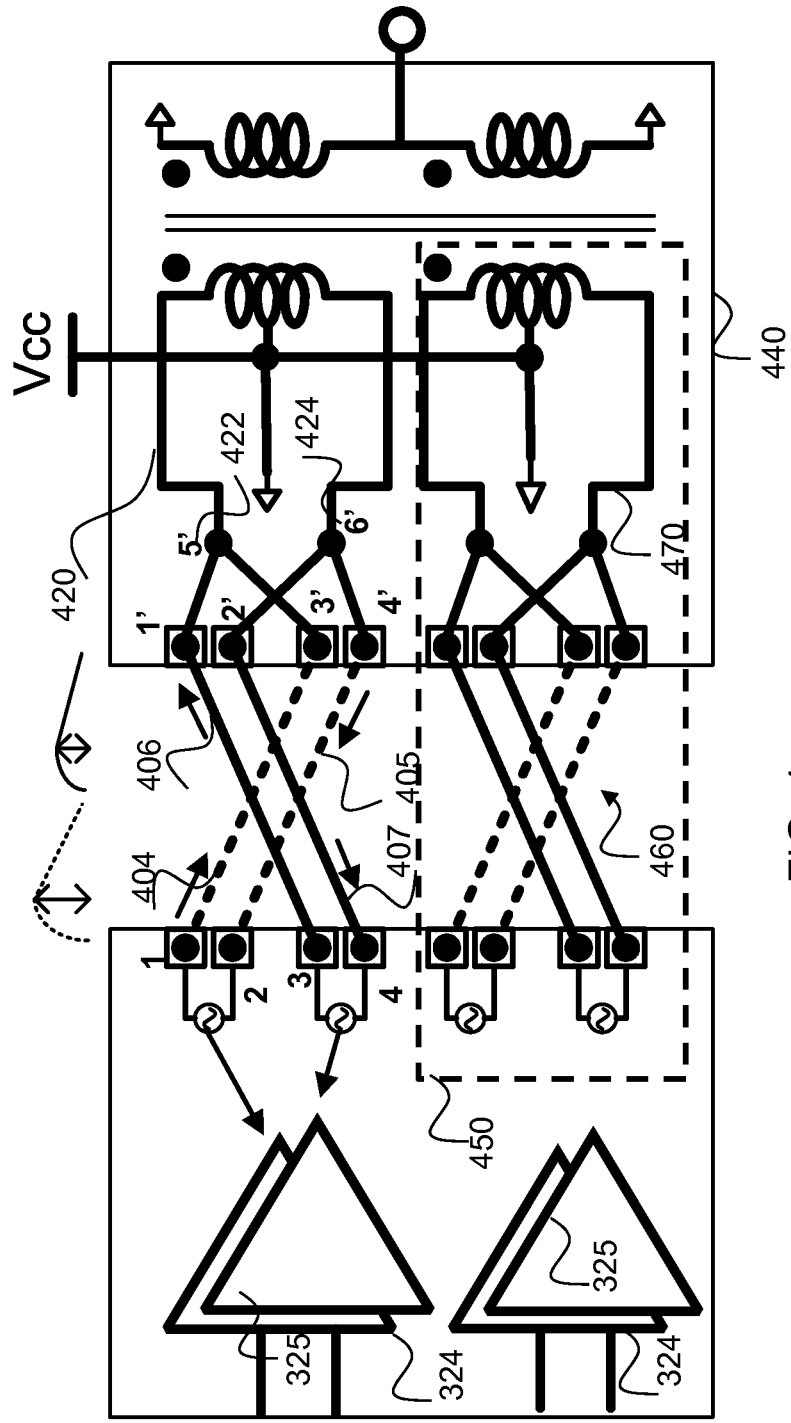
FIG. 4 illustrates an example of a modified integrated RF PA system incorporating aspects of the invention.

Referring now to FIG. 4, a block diagram of an example integrated power combiner device 440 is shown with respective coupled components, according to some examples of the invention. FIG. 4 comprises, power amplifier modules 324, 325 operably cross-coupled, via a first pair of bond wires 404, 405 and a second pair of bond wires 406, 407, to nodes of integrated power combiner device 440, which may in some examples be a power combiner module. The bond wires 404, 405, 406, 407 may be formed of any suitable metal or alloy, for example copper or aluminium. In this example, the first pair of bond wires 404, 405 and the second pair of bond wires 406, 407 may each form a differential pair of bond wires. In this example, the bond wires 404, 405, 406, 407 may range from, for example, 100 μm to 2 mm. Further, the coupling distance between the bond wires 404, 405, 406, 407 may be user defined, with a minimum coupling distance of around 50 μm.

Therefore, current flowing within the first pair of bond wires 404, 405 may have opposing phase between bond wire 404 and bond wire 405. Similarly, current flowing within the second pair of bond wires 406, 407 may have opposing phase between bond wire 406 and bond wire 407. As a result, any inductively induced magnetic fields within the first pair of bond wires 404, 405 may exhibit an opposing magnetic field in bond wire 404 when compared to bond wire 405. Similarly, any inductively induced magnetic fields within the second pair of bond wires 406, 407 may exhibit an opposing magnetic field in bond wire 406 when compared to bond wire 407. In this example, the first pair of bond wires 404, 405 may be cross coupled with respect to the second pair of bond wires 406, 407 to nodes within integrated power device 440, thereby forming a set of double cross-coupled bond wires. Further, the opposing magnetic fields within the first pair of bond wires 404, 405 and the second pair of bond wires 406, 407 may exhibit the effect of reducing magnetic coupling between the respective bond wires. Furthermore, magnetic coupling may be reduced between the bond wires 404, 405, 406, 407 and inductive elements of the integrated power device 440 due to the opposing magnetic fields within the first pair of bond wired 404, 405 and the second pair of bond wires 406, 407. Inductive elements of the integrated power device may comprise, for example, first primary winding 420 and/or second primary winding 470.

An example of current flow between power amplifier modules 324, 325 and integrated power combiner device 440 is shown by arrows in FIG. 4. It should be noted that this is only one possible configuration for current flow, and it is possible that the current flows denoted by the arrows can be reversed or altered to provide a similar result without deviating from concepts of the invention.

In some examples, bond wires 404 and 406 may be considered as a first pair of cross-coupled bond wires and bond wires 405 and 407 may be considered as a second pair of cross-coupled bond wires. In this example, bond wire 404 of the first pair of bond wires may be operably coupled to node (1) of the power amplifier module 324 and node (3') of the integrated power combiner device 440. Further, bond wire 406 of the second pair of bond wires may be operably coupled to node (3) of the power amplifier module 324 and node (1') of the integrated power combiner device 440.

Further, the current from cross coupled bond wires 404 and 406 may be received at nodes (3') and (1') respectively, and combined at node 5 422, which may be situated between node (1') and first primary winding 420 of integrated power combiner device 440. The current flowing in bond wires 404 and 406 may be in-phase, and may be cross-coupled before being received at integrated power combiner device 440. In some examples, node (5') 422 may form a first differential node for first primary winding 420.

In this case, there may be a fixed current at node (5') that may be formed from a combination of received currents from cross-coupled bond wires 404 and 406, which may be in-phase with respect to each other. Therefore, current at node (5') may flow through first primary winding 420 to node (6') 424. In some examples, node (6') 424 may form a second differential node for first primary winding 420, whereby the current may be distributed from node (6') 424 to nodes (2') and (4'). In this case, bond wire 405 of the first pair of bond wires may be operably coupled to node (4') of the integrated power combiner device 440 and node (2) of the power amplifier modules 324. Further, bond wire 407 of the second pair of bond wires may be operably coupled to node (2') of the integrated power combiner device 440 and node (4) of the power amplifier modules 324.

In some further examples, the current flow between bond wires 404, 407 and 406, 405 may form a pseudo figure-8 shaped current loop, which may further reduce magnetic coupling between bond wires 404, 405, 406, 407, and inductive components of the integrated power combiner device 440. For example, current at node (1) may flow, via bond wire 404, through first primary winding 420 via nodes (3') and (5'), and return to node (2), via bond wire 405, via nodes (6') and (4'). Further, current may flow at node (3), via bond wire 406, through first primary winding 420 via nodes (1') and (5'), and return to node (4), via bond wire 407, via nodes (6') and (2').

Therefore, in this example, the current flow between bond wires 404, 407 and 406, 405 forms pseudo figure-8 shaped current paths, which may reduce magnetic coupling between the bond wires, particularly in on-chip inductive components. In this manner, double cross-coupled bond wires between the PA integrated circuit and the integrated power combiner device 440 may be able to reduce any mutual coupling effect between the inductive components of the integrated power combiner device 440 and the bond wires.

In some examples, the above operation of the double cross-coupled bond wires operably coupling an output of power amplifiers 324, 325 with an integrated power combiner device 440 may be repeated for secondary region 450, which may comprise a further set of double cross-coupled bond wires 460, power amplifier module 324 and a second primary winding 470. In some examples, power amplifier module 324 may comprise a plurality of power amplifier modules.

One advantage of utilising double cross-coupled bond wires may be that mutual coupling between the cross-coupled bond wires and inductive components within the integrated power combiner device 440 may be reduced. In some examples, the opposing phase and current flow between bond wires 404 and 405 of the first pair of bond wires may induce opposite magnetic fields in the two bond wires 404 and 405. This may cause electromagnetic field cancellation within the first pair of bond wires 404, 405. Similarly, the opposing phase and current flow between bond wires 406 and 407 of the second pair of bond wires may induce opposite magnetic fields in the two bond wires 406 and 407. This may also cause electromagnetic field cancellation within the second pair of bond wires 406, 407.

In this manner, by utilising electromagnetic field cancellation between bond wires, an improvement in power efficiency in transferring radio frequency power from the inputs of a plurality of power amplifier devices 324, 325 to an output of an integrated power combiner device 440 may be achieved. Furthermore, such an improvement may be achieved without increasing the spacing between the bond wires and the inductive components in integrated power combiner devices.

In some examples, the current flowing in bond wires and integrated power combiner device 440 may approximate a double 8-shaped current loop.

Although the examples illustrated in FIG. 4 are shown with centre-tapped primary windings, it should be noted that, in other examples, a singular inductive element winding, may be utilised with the invention or a plurality of inductive elements that may or may not be centre-tapped.

In some examples, cross-coupled bond wires 404 and 406 may form a first pair of cross-coupled bond wires that may be operably coupled to a second input terminal, which may be a positive terminal, of first primary winding 420.

In this example, the first pair of cross-coupled bond wires 404, 406 may be output from different power amplifier modules 324, 325 to a respective one of a plurality of paired output terminals (1-2; 3-4), where a pair of output terminals are coupled between a respective amplifier stage and a first paired input terminal (1'-3' or 2'-4'). The first paired input terminal (1'-3' or 2'-4') is then connected to a respective second input terminal (5', 6'). Further, cross coupled bond wires 405 and 407 may form a second pair of cross coupled bond wires. These nodes (2') and (4') may be operably coupled to a second terminal, which may be a negative terminal, of first primary winding 420, which may be node (6') (424).

In this example, a second pair of cross-coupled bond wires 405 and 407 may be operably coupled to nodes (2) and (4) of the different power amplifier modules. In this example, a first power amplifier module 324 may comprise nodes (1) and (2), and a second power amplifier module 325 may comprise nodes (3) and (4). Further, the positive terminal node (5') (422) of first primary winding 420 may comprise nodes (1') and (3'), and the negative terminal (6') (424) of first primary winding 420 may comprise nodes (2') and (4'). In this example, current may flow from output terminals (1) and (3) to second input terminal (5') 422, via first paired input terminals (3') and (1'). Thereafter, the current may flow out of second input terminal (6') 424 to output terminals (2) and (4), via paired output terminals (2') and (4'), thereby forming a plurality of figure-8 loops.

Figure 5:
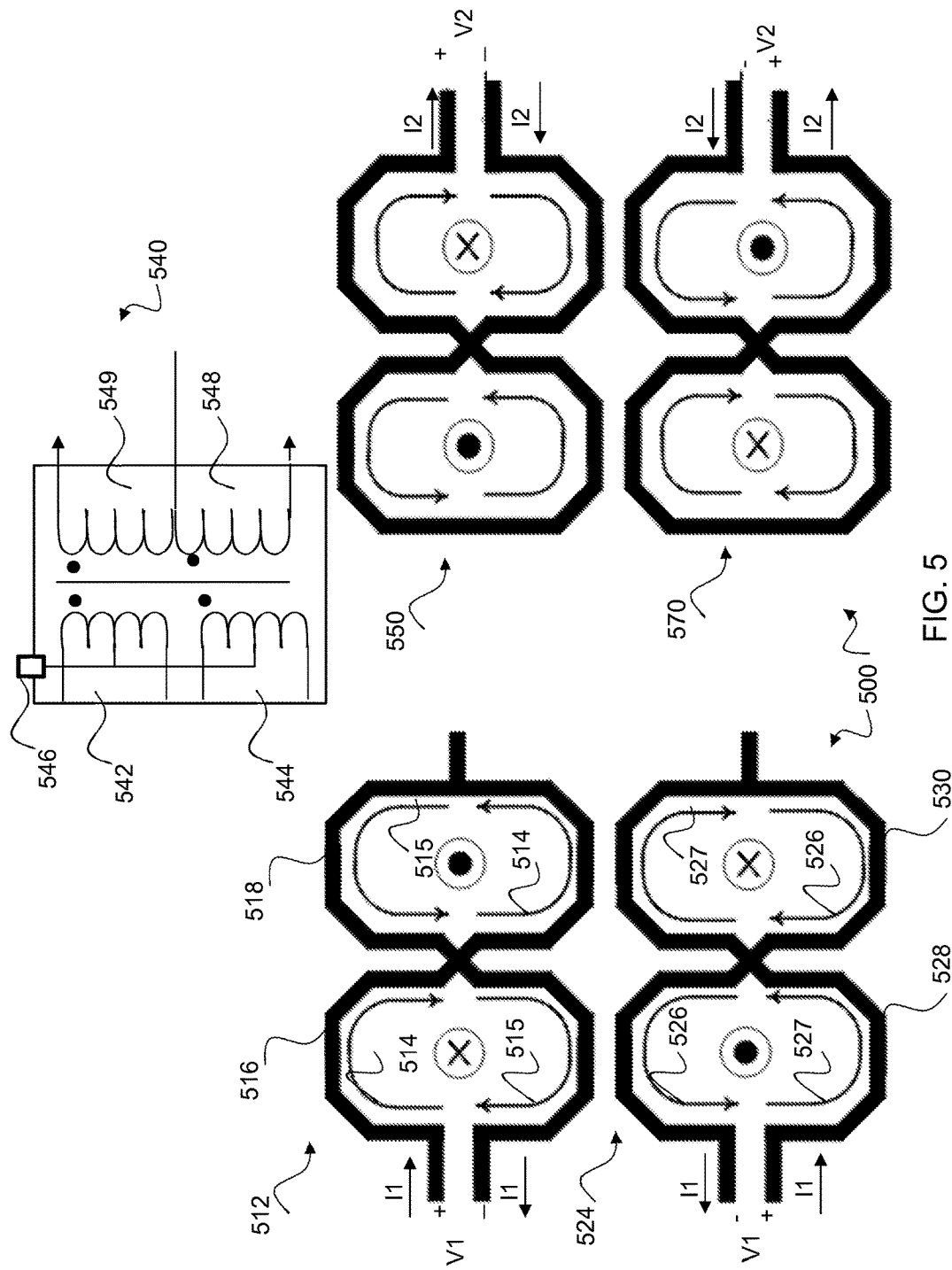
FIG. 5 illustrates an example of a power combiner utilising aspects of the invention.

Referring now to FIG. 5, an example of an alternative power combiner 500 is illustrated that utilises aspects of the invention. A power combiner schematic 540 is used to illustrate how parts of alternative power combiner 500 may be utilised in combination. In this example, power combiner schematic 540 may comprise two primary windings 542, 544, which may be operably coupled to each other via a centre tap 546, as well as being magnetically coupled to secondary windings 548, 549.

Referring now to alternative power combiner 500, there is illustrated an alternative primary winding layout 512, 524 according to aspects of the invention. In this example, first primary winding 512 may comprise a figure-8 type layout, wherein current I1 may flow through the figure-8 type layout according to arrows 514 and 515. In this example, the current flowing through first section 516 (denoted by current flow 514) of first primary winding 512 is reversed when compared to the current flowing through second section 518 (denoted by current flow 515) of first primary winding 512. Therefore, any magnetic fields induced in the first section 516 of first primary winding 512 may be anti-phase compared to any induced magnetic fields in the second section 518 of first primary winding 512. Similarly, referring now to second primary winding 524 that may also comprise a figure-8 type layout, wherein current I1 flows through the figure 8 type layout according to arrows 526 and 527. In this example, the current flowing through the first section 528 (denoted by current flow 527) of second primary winding 524 is reversed when compared to the current flowing through second section 530 (denoted by current flow 526) of second primary winding 524. As a result, any induced magnetic fields in the first section 528 and second section 530 of second primary winding 524 may be anti-phase when compared to each other.

In this manner, the power combiner of FIG. 5, which is suitable for a radio frequency (RF) transmitter, comprises a first 512 planar figure-8 shaped primary winding located adjacent a second 524 planar figure-8 shaped primary winding, which in combination thereby form a figure-88 shaped primary winding. Additionally, a first 550 planar figure-8 shaped secondary winding located adjacent a second 570 planar figure-8 shaped secondary winding forms a figure-88 shaped secondary winding. Notably, when the figure-88 shaped primary winding is substantially overlaid with the figure-88 shaped secondary winding, the coupling between first primary winding 512 and second primary winding 524 may be reduced, or cancelled altogether, due to a configured phase mismatch between generated magnetic fields.

In this example, primary windings 512, 524 may be coupled with secondary windings 550, 570, which may also comprise a figure-8 type structure. In this case, primary windings 512, 524 may be positioned substantially over or under secondary windings 550, 570 in such a way as to maximise coupling between primary windings 512, 524 and secondary windings 550, 570. Therefore, current flowing through secondary windings 550, 570 may be substantially the reverse of that in corresponding primary windings 512, 524. Utilising the figure-8 structure for primary 512, 524 and secondary windings 550, 570 may allow for symmetric coupling between primary windings 512, 514 and secondary windings 550, 570, thereby potentially reducing any mutual coupling between windings. Further, each figure-8 shaped primary 512, 524 may be operably coupled to each corresponding figure-8 shaped secondary 550, 570. Utilising the figure-8 structure may further reduce coupling between primary windings 512 and 524.

In one example, a plurality of the first planar figure-8 shaped primary and secondary windings (512, 524, 550, 570) may be formed from two substantially oval-shaped tracks that are operably cross coupled substantially at a mid-point of a longest length of the oval shape.

Referring now to FIG. 6, examples of the 'figure-88 power combiner' of FIG. 5 are illustrated, whereby the planar figure-8 shaped primary windings are coupled to the planar figure-8 shaped secondary windings 550, 570 in a symmetrical manner. Additionally, in FIG. 6, examples of a figure-88 power combiner employing mirror differential excitation 605 and sequential differential excitation 650 forms of voltage-mode power combining are illustrated. Thus, in order to support differential excitation the first and second planar figure-8 shaped primary windings each comprise a first and second input port arranged to support differential excitation. Furthermore, the first and second planar figure-8 shaped secondary windings each comprise a first and second output/coupling port arranged to support differential excitation.

In these examples, mirror differential excitation 605 refers to, and encompasses, the input signal's phase relationship between windings 608, 610 and windings 612, 614. For example, in mirror differential excitation 605, the current flowing in windings 608, 610 is 'mirrored' in windings 612, 614. Therefore, the current flow is 'mirrored' in windings 612, 614, compared to windings 608, 610, leading to a phase change in current flowing between the two sets of windings.

In sequential differential excitation 650, current flows sequentially in windings 655, 660 and windings 665, 670. Therefore, there is no 'mirroring' in this example, which negates any phase change in current flowing between the two sets of windings.

In some examples, mirrored differential excitation 605 and sequential differential excitation 650 alter the phase of each transformer, which may alter output port combinations.

Referring first to mirror differential excitation 605, power amplifier modules 607 may be operably coupled, via bond wires 609, to primary windings 608 of power combiner 605 that are denoted by solid lines. In some examples, bond wires 609 may be double cross-coupled bond wires.

In this example, outputs from secondary windings 610, 614, denoted by hashed lines, may be coupled in a variety of ways. In this example, negative output port (2) of secondary winding 610 and positive output port (4) of secondary winding 614 may be operably coupled together, leading to a 2*V2 voltage at output port (1) of secondary windings 610. Further, output port (3) may be operably coupled to ground. In this example, port (1) may have positive polarity and port (2) may have negative polarity. These polarities may be mirrored in ports (3) and (4), wherein port (3) may have negative polarity and port (4) may have positive polarity.

Thus, in this manner, the second port (2) of the first planar figure-8 shaped secondary winding 610 is operably coupled to the second port (4) of the second planar figure-8 shaped secondary winding 614, thereby supporting mirror differential excitation voltage mode combining. In this example, the first port (1) of the first planar figure-8 shaped secondary winding 610 is arranged to provide an output current following mirror differential excitation voltage mode combining.

Referring now to 650, power amplifier modules 651 may be operably coupled, via bond wires 652, to primary windings 655 of power combiner 650 that are denoted by solid lines. In some examples, bond wires 652 may be double cross coupled bond wires. In this example, outputs from secondary windings 660, denoted by hashed lines, may be coupled in a variety of ways. In this example, negative output port (2) may have been operably coupled to positive output port (3), leading to a 2*V2 voltage at port (1) of secondary windings 660. Further, output port (4) may have been operably coupled to ground. In this example, ports (1) and (3) of secondary windings 660 may have positive polarities and ports (2) and (4) of secondary windings 660 may have negative polarities.

Thus, in this manner, the second port (2) of the first planar figure-8 shaped secondary winding 660 is operably coupled to the first port (3) of the second planar figure-8 shaped secondary winding 670, thereby supporting sequential differential excitation voltage mode combining. In this example, the first port (1) of the first planar figure-8 shaped secondary winding 660 is arranged to provide an output current following sequential differential excitation voltage mode combining.

In some examples, power combiners 605 and 650 may be utilised with series connections to a plurality of other power combiners in order to sum output voltages at each power combiner. In some examples, this may be achieved by 'stacking' the plurality of power combiners 605, 650 together in series. In some cases, each of the plurality of power combiners 605, 650 may have different excitations that have different phase values at the output of the power combiner coils. By configuring the output connections from the secondary windings 610, 660, the 'Stacked output' may exhibit in-phase combined voltage at the output.

It should be noted that other layouts and polarities of the nodes are envisaged within the concepts herein described, and the illustrated examples relating to FIG. 6 should not be seen as limiting.

Figure 7:
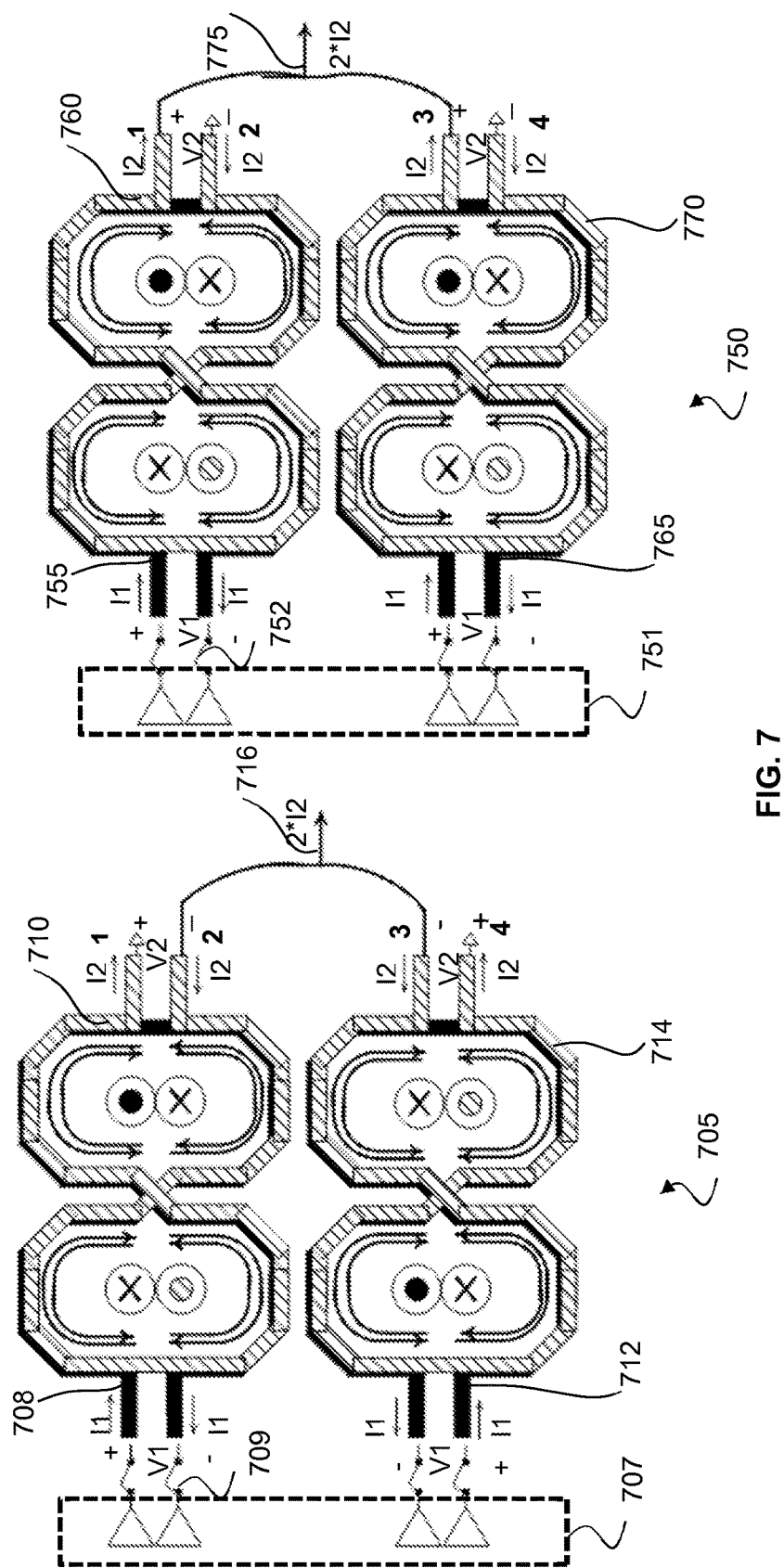
FIG. 7 illustrates a yet further example of an alternative power combiner utilising aspects of the invention.

Referring now to FIG. 7, yet further examples of the 'figure-88 power combiner' of FIG. 5 are illustrated utilising mirror differential excitation 705 and sequential differential excitation 750 forms of current-mode power combining. Referring first to mirror differential excitation 705, power amplifier modules 707 may be operably coupled, via bond wires 709, to primary windings 708 of power combiner 705 that are denoted by solid lines. In some examples, bond wires 709 may be double cross coupled bond wires. In this example, outputs from secondary windings 710, 714 denoted by hashed lines, may be coupled in a variety of ways. For example, negative output port (2) and negative output port (3) of secondary windings 710 may be operably coupled together, leading to a 2*I2 output current at these nodes. Further, output ports (1) and (4) of secondary windings 710, 714 may be operably coupled to ground. In this example, output ports (1) and (4) of secondary windings 710, 714 may have positive polarity and output port (2) of secondary winding 710 and port (3) of secondary winding 714 may have negative polarity.

Thus, in this manner, the second port (2) of the first planar figure-8 shaped secondary winding 710 is operably coupled to the first port (3) of the second planar figure-8 shaped secondary winding 714 and provide an output current 716, thereby supporting mirror differential excitation current mode combining.

Referring now to 750, power amplifier modules 751 may be operably coupled, via bond wires 752, to primary windings 755, 765 of power combiner 750 that are denoted by solid lines. In some examples, bond wires 752 may be double cross coupled bond wires. In this example, outputs from secondary windings 760, 770 denoted by hashed lines, may be coupled in a variety of ways. In this example, positive output port (1) of secondary winding 760 and port (3) of secondary winding 770 may be operably coupled together, leading to a 2*I2 output current 775 at these nodes. Further, output port (2) of secondary winding 760 and port (4) of secondary windings 770 may be operably coupled to ground. In this example, output port (1) of secondary winding 760 and port (3) of secondary windings 770 may have positive polarity and output port (2) of secondary winding 760 and port (4) of secondary windings 770 may have negative polarity.

Thus, in this manner, the first port (1) of the first planar figure-8 shaped secondary winding 760 is operably coupled to the first port (3) of the second 770 planar figure-8 shaped secondary winding and provide an output current 775, thereby supporting sequential differential excitation current mode combining.

In some examples, power combiners 705 and 750 may be utilised with parallel connections to a plurality of other power combiners in order to sum output currents at each power combiner. In some examples, this may be achieved by 'stacking' the plurality of power combiners 705, 750 together in parallel. In some cases, each of the plurality of power combiners 705, 750 may have different excitations that have different phase values at the output of the power combiner coils. By configuring the output connections from the secondary windings 710 or 760 and 770, the 'Stacked output' may have in-phase combined current at the output.

The illustrated examples in FIG. 6 and FIG. 7 may have substantially the same example advantages as recited for the illustrated examples given in FIG. 5. For example, an effect of the figure-8 structures may be that coupling between primary windings and secondary windings may be reduced, or in some examples cancelled altogether, due to a phase mismatch between magnetic fields. Further, the figure 8 structures of the primary windings and secondary windings may enhance coupling between the windings. Further, the figure-8 structure may potentially reduce any mutual coupling between first and second sections of primary and secondary windings. In other examples, any number of primary windings and/or secondary windings may be utilised in conjunction with any number of power amplifier modules.

Further, in some examples, utilising mirror and sequential differential excitation in FIG. 6 and FIG. 7 may reduce and/or cancel coupling between adjacent transformers, without reducing or cancelling coupling between primary and secondary windings of the transformers.

In some examples, the bond wires 609 of the mirror differential excitation power combiner and sequential differential excitation form of voltage-mode power combining may comprise cross-coupled bond wires other than double cross-coupled bond wires, as illustrated in FIG. 8.

Referring now to FIG. 8, an example implementation utilising conventional T-core power combiners 805, 850 is illustrated.

In this example, Tcore power combiner 805 may utilise a mirror differential excitation form of voltage-mode power combining, whereas Tcore power combiner 850 may utilise a sequential differential excitation form of voltage-mode power combining. Referring first to the mirror differential excitation Tcore power combiner 805, power amplifier modules 807 may be operably coupled, via bond wires 809, to primary windings 808, 811 of mirror differential excitation Tcore power combiner 805 that are denoted by solid lines. In this example, due to the asymmetric nature of the mirror differential excitation Tcore power combiner 805, the polarities at the primary windings 808, 811 may be reversed when compared to corresponding polarities at the secondary windings 810, 812, denoted by hashed lines. In this example, positive output port (2) may be operably coupled to negative output port (4) of secondary windings 810, 812, leading to a 2*V2 voltage at output port (1) of secondary windings 810, 812. Further, output port (2) may be operably coupled to ground. In this example, port (1) and port (4) may have negative polarity, and port (2) and port (3) may have positive polarity.

Referring now to 850, power amplifier modules 851 may be operably coupled, via bond wires 852, to primary windings 855, 856 of sequential differential excitation Tcore power combiner 850 that are denoted by solid lines. In this example, due to the asymmetric nature of the sequential differential excitation Tcore power combiner 850, polarities at the primary windings 855, 856 may be reversed when compared to corresponding polarities at secondary windings 860, 861, denoted by hashed lines. In this example, positive output port (2) may be operably coupled to negative output port (3), of secondary windings 860, 861, leading to a 2*V2 voltage at output port (1) of secondary windings 860. Further, output port (4) may be operably coupled to ground. In this example, output ports (1) and (3) may have negative polarity, and output ports (2) and (4) may have positive polarity.

Figure 9:
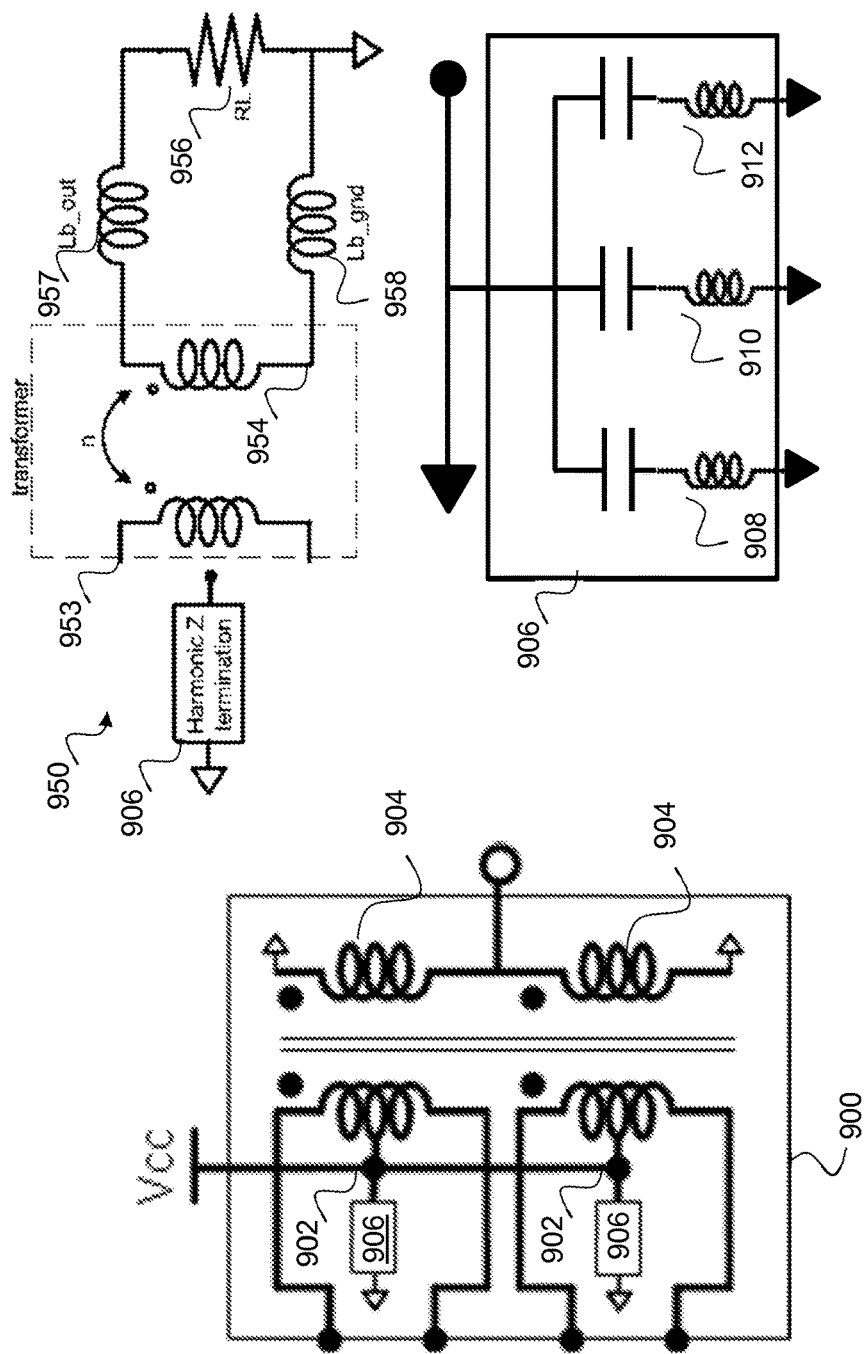
FIG. 9 illustrates an example of termination in a power combiner utilising aspects of the invention.

Referring to FIG. 9, an example of a termination module for a power combiner module 900 is illustrated. In this example, power combiner module 900 may comprise at least one centre tapped primary winding 902, coupled to at least one output secondary winding 904.

Generally, in the art, the centre tapped primary windings 902 are grounded, or impedance matched to the fundamental frequency of a circuit that they are utilised with. However, circuits of this type still suffer from parasitic impedances and imbalanced impedance transformations. The inventors have recognised and appreciated that these problems may, in part, be due to poor harmonic suppression.

Therefore, in accordance with some examples, power combiner module 900, employs at least one harmonic termination module 906. In a power combiner with two primary windings, one example of the invention may couple at least one harmonic termination module 906 to each centre tapped primary winding 902, as shown. In this example, the at least one termination module 906 may comprise at least one harmonic termination circuit, for example a notch filter frequency response, configured for a given harmonic frequency of a device utilising the power combiner module 900. In some other examples, the at least one termination module 906 may comprise a plurality of terminations for a plurality of harmonic frequencies.

In this example, harmonic terminations in a form of a notch filter may comprise at least one charge storage device (e.g. a capacitor) in series with at least one inductive element, per frequency.

In one example, the at least one harmonic termination module 906 may comprise terminations for fundamental frequency f0 908, and third harmonic frequency 3fc 912 of the power combiner 900. In this example, fundamental frequency f0 908 and third harmonic frequency terminations 3fc 912 may be employed to reduce any common mode voltages that may appear in the power combiner 900, for example by reducing any voltage swing on the centre taps 902 of power combiner 900.

In another example, second harmonic frequency termination 910 (and one or more other even multiple harmonic terminations) may be utilised to minimise the effect of any second (or higher) harmonic leakage coupled back to primary windings 902 and 904.

Thus, one advantage of utilising the at least one termination module 906 may be that power combiner 900 is more balanced due to lower PA output impedance values at harmonic frequencies present within power combiner 900.

In a further example, a further power combiner 950 comprising a single primary winding 953, and a single secondary winding 954 operably coupled to a load 956, may have at least one harmonic termination module 906 coupled to the primary winding 953. In this example, the at least one harmonic termination module 906 may comprise at least one harmonic termination circuit, for example a notch filter frequency response, configured for a given harmonic frequency of a device utilising the power combiner module 950. In some other examples, the at least one termination module 906 may comprise a plurality of terminations for a plurality of harmonic frequencies. In this example, inductances 957 and 958 relate to possible loading on the output 956, and do not relate to harmonic termination module 906.

In some other examples (not shown), it is envisaged that current may be fed through one or more secondary windings of power combiner 900. Therefore, in this example, harmonic termination module 906 may be operably coupled to one or more secondary windings of power combiner 900.

Examples of the invention herein before described and illustrated in the FIGs may be used in isolation or in any combination. In particular, it is envisaged that the aforementioned inventive concept can be applied by a semiconductor manufacturer to any integrated circuit comprising radio frequency circuits. In particular, the inventive concept can be applied to any circuit comprising high power radio frequency combiners. It is further envisaged that, for example, a semiconductor manufacturer may employ the inventive concept in a design of a stand-alone device, such as a RF power amplifier, duplexer, antenna switch, power combiner, or corresponding application-specific integrated circuit (ASIC) and/or any other sub-system element.

It will be appreciated that, for clarity purposes, the above description has described embodiments of the invention with reference to different functional units. However, it will be apparent that any suitable distribution of functionality between different functional units, for example with respect to the coupling between the power amplifier stages and antenna, may be used without detracting from the inventive concepts herein described. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved radio frequency transmitter, power combiners and termination modules therefor have been described, wherein the aforementioned disadvantages with prior art arrangements have been substantially alleviated.

What is claimed is:

1. A power combiner for a radio frequency, RF, transmitter comprising:
   a first planar figure-8 shaped primary winding configured to support current flow in a figure-8 pattern;
   a second planar figure-8 shaped primary winding that with the first planar figure-8 shaped primary winding forms a figure-88 shaped primary winding, the second planar figure-8 shaped primary winding being configured to support current flow in a figure-8 pattern;
   a first planar figure-8 shaped secondary winding configured to support current flow in a figure-8 pattern; and
   a second planar figure-8 shaped secondary winding that with the first planar figure-8 shaped secondary winding forms a figure-88 shaped secondary winding, the second planar figure-8 shaped secondary winding being configured to support current flow in a figure-8 pattern;
   wherein, the figure 8 figure-88 shaped primary winding is substantially overlaid with the figure 8 figure-88 shaped secondary winding.

2. The power combiner of claim 1, wherein the overlaid location of the figure-88 shaped primary winding and figure-88 shaped secondary winding is operable to facilitate reduction of inductive coupling.

3. The power combiner of claim 1, wherein a plurality of the first planar figure-8 shaped primary and secondary windings are formed from two substantially oval-shaped tracks that are operably cross coupled substantially at a mid-point of a longest length of the oval shape.

4. The power combiner of claim 1, wherein current flowing through a first section of the of the first planar figure-8 shaped primary winding is reversed when compared to current flowing through a second section of the first planar figure-8 shaped primary winding, thereby forming anti-phase induced magnetic fields between the first section and second section of the first primary winding.

5. The power combiner of claim 1, wherein the first planar figure-8 shaped primary winding and second planar figure-8 shaped primary windings each comprise a first and second coupling port wherein current is operable to flow into the first coupling port and out of the second coupling port.

6. The power combiner of claim 5, wherein the current operable to flow into the first coupling port has a magnetic field that is anti-phase with a current operable to flow out of the second coupling port.

7. The power combiner of claim 6, wherein a phase difference between the current operable to flow into the first coupling port and the current operable to flow out of the second coupling port is substantially an odd multiple of a wavelength of a signal being carried by the power combiner.

8. The power combiner of claim 7, wherein the phase difference between the current operable to flow into the first coupling port and the current operable to flow out of the second coupling port is operable to reduce coupling between the first planar figure-8 shaped primary winding and the second planar figure-8 shaped primary winding.

9. The power combiner of claim 1, wherein the first planar figure-8 shaped secondary winding and second planar figure-8 shaped secondary winding each comprise a first and second coupling port arranged to support differential excitation.

10. The power combiner of claim 9, wherein a second port of the first planar figure-8 shaped secondary winding is operably coupled to the second port of the second planar figure-8 shaped secondary winding, thereby supporting mirror differential excitation voltage mode combining.

11. The power combiner of claim 10, wherein a first port of the first planar figure-8 shaped secondary winding is arranged to provide an output voltage following mirror differential excitation voltage mode combining.

12. The power combiner of claim 9, wherein a second port of the first planar figure-8 shaped secondary winding is operably coupled to the first port of the second planar figure-8 shaped secondary winding, thereby supporting sequential differential excitation voltage mode combining.

13. The power combiner of claim 12, wherein a first port of the first planar figure-8 shaped secondary winding is arranged to provide an output voltage following sequential differential excitation voltage mode combining.

14. The power combiner of claim 9, wherein a second port of the first planar figure-8 shaped secondary winding is operably coupled to the first port of the second planar figure-8 shaped secondary winding and provide an output current, thereby supporting mirror differential excitation current mode combining.

15. The power combiner of claim 9, wherein a first port of the first planar figure-8 shaped secondary winding is operably coupled to the first port of the second planar figure-8 shaped secondary winding and provide an output current, thereby supporting sequential differential excitation current mode combining.

16. A radio frequency transmitter comprising a power combiner comprising:
a first planar figure-8 shaped primary winding configured to support current flow in a figure-8 pattern;
a second planar figure-8 shaped primary winding that with the first planar figure-8 shaped primary winding forms a figure-88 shaped primary winding, the second planar figure-8 shaped primary winding being configured to support current flow in a figure-8 pattern;
a first planar figure-8 shaped secondary winding configured to support current flow in a figure-8 pattern; and
a second planar figure-8 shaped secondary winding that with the first planar figure-8 shaped secondary winding forms a figure-88 shaped secondary winding, the second planar figure-8 shaped secondary winding being configured to support current flow in a figure-8 pattern;
wherein, the figure-88 shaped primary winding is substantially overlaid with the figure-88 shaped secondary winding.

17. The radio frequency transmitter of claim 16, wherein a plurality of the first planar figure-8 shaped primary and secondary windings are formed from two substantially oval-shaped tracks that are operably cross coupled substantially at a mid-point of a longest length of the oval shape.

18. The radio frequency transmitter of claim 16, wherein the overlaid location of the figure-88 shaped primary winding and figure-88 shaped secondary winding is operable to facilitate reduction of inductive coupling.

* * * * *